United States Patent [19]

Hiraiwa et al.

[11] Patent Number: 5,172,070
[45] Date of Patent: Dec. 15, 1992

[54] APPARATUS FOR DIGITALLY DEMODULATING A NARROW BAND MODULATED SIGNAL

[75] Inventors: Hisaki Hiraiwa, Kanagawa; Mitsuhiro Suzuki, Tokyo, both of Japan

[73] Assignee: Sony Corporation, Tokyo, Japan

[21] Appl. No.: 787,527

[22] Filed: Nov. 4, 1991

[30] Foreign Application Priority Data

Nov. 9, 1990 [JP] Japan ................... 2-305567

[51] Int. Cl.$^5$ ............................................. H03D 3/00
[52] U.S. Cl. .................................... 329/304; 329/327
[58] Field of Search ............... 329/304, 315, 323, 327, 329/345; 455/214, 312, 337

[56] References Cited

U.S. PATENT DOCUMENTS 4,737,728  4/1988  Nakamura et al. ................. 329/304
5,077,531  12/1991  Takeuchi et al. ................... 329/304

Primary Examiner—Robert J. Pascal
Attorney, Agent, or Firm—Philip M. Shaw, Jr.

[57] ABSTRACT

A digital demodulating apparatus which is high in accuracy in operation and simple in construction. The digital demodulating apparatus comprises an analog to digital converter for converting an input modulated signal having a carrier frequency of fc and a band width of 2B into a digital signal with a sampling clock signal of a sampling frequency of fs, a sampling clock generating circuit for generating a clock signal of the sampling frequency fs which is defined as $$fc \approx (2m+1)/4 \cdot fs$$

and $$fs > 4B$$

m being an arbitrary integer, an orthogonal component extracting circuit for extracting, from an output digital signal of the analog to digital converter, two components which are different by (an odd number/2)·$\pi$ in phase from each other, and a demodulator of the digital signal processing type for receiving such two extracted components from the orthogonal component extracting circuit and producing a demodulated signal from the two received components.

3 Claims, 4 Drawing Sheets

APPARATUS FOR DIGITALLY DEMODULATING A NARROW BAND MODULATED SIGNAL

BACKGROUND OF THE INVENTION

1. Field of the Invention

This invention relates to a digital demodulating apparatus for demodulating, for example, a received narrow band modulated signal using digital signal processing.

2. Description of the Prior Art

A demodulating apparatus is employed in a radio wave receiver which receives a narrow band signal such as a mobile radio telephone set or such as an automobile telephone set. Such a demodulating apparatus is often constructed so as to conduct digital signal processing, and in such construction, it performs so-called quasi-synchronous detection in order to effect analog to digital conversion.

FIG. 6 shows an exemplary conventional demodulating apparatus which performs such quasi-synchronous detection. Referring to FIG. 6, the demodulating apparatus shown is constructed so as to receive and demodulate a signal of the PSK/TDMA communications system and includes a band pass filter 11 to which a received M-phase PSK signal is supplied. The band pass filter 11 thus removes out-band components, that is, unnecessary frequency band components other than an object frequency band component from the received M-phase PSK signal. An output signal r(t) of the band pass filter 11 is represented by the following expression:

$$r(t) = \sqrt{a}\, \cos(2\pi fc't + \phi k + \theta r) + n(t) \quad (1)$$

where A is a level of a magnitude, fc' is a frequency of a carrier, $\phi k$ is information of a phase of a k-th symbol, $\theta r$ is an initial phase, T is a period of symbols, and n(t) is a noise, and $(k-1)T \leq t \leq kT$.

Such an output signal of the band pass filter 11 is supplied to a pair of mixer circuits 12C and 12S.

The demodulating apparatus further includes a fixed oscillator 13 for generating a reference signal Rc(t) having a fixed frequency fc in the proximity of the carrier frequency fc' and an initial phase $\theta_R$. An output signal of the fixed oscillator 13 is supplied to the mixer circuit 12C and also to a $\pi/2$ phase shifting circuit 14, by which the phase of the signal Rc(t) from the fixed oscillator 13 is shifted by $\pi/2$ to obtain a reference signal Rs(t). The reference signal Rs(t) thus obtained is supplied to the other mixer circuit 12S. Consequently, an output signal of the band pass filter 11 is quasi-synchronously detected with such two reference signals Rc(t) and Rs(t) which have an orthogonal relationship in phase to each other.

Output signals of the mixer circuits 12C and 12S are supplied to a pair of low-pass filters 15C and 15S, respectively, at which high frequency components are removed from the signals, and then the signals are supplied to a pair of analog to digital (A/D) converters 16C and 16S, respectively, at which the signals are converted into digital signals. Here, the sampling frequency at the analog to digital converters 16C and 16S is defined as $f > 2B_1$ where $B_1$ is a band pass width of the band pass filter 11 so that it may satisfy a sampling theorem.

Digital data of two quasi-synchronous detection signals having an orthogonal relationship in phase to each other which are obtained from the analog to digital converters 16C and 16S in this manner are represented in the following manner in complex number representation;

$$x = x(t) = Ae^{-j(2\pi fet + \phi k + \theta e)} + n'(t) \quad (2)$$

where fe is a difference between the fixed frequency fc of the reference signal and the carrier frequency fc' of a received signal, and $\theta e$ is a difference in initial phase between the reference signal and the received signal. If the parameters fe and $\theta e$ can be presumed, then two reference signals having orthogonal phases to each other and synchronized with the received signal can be reproduced. If such two signals having an orthogonal phase relationship to each other are obtained, then a magnitude and a phase of the input signal can be demodulated from the two signals.

Digital data from the analog to digital converters 16C and 16S are supplied once to a buffer memory 17 and then to a demodulator 18 of the digital signal processing type. At the demodulator 18, frequency and phase as described above is presumed to conduct demodulation of the two input signals.

The conventional demodulating apparatus described above, however, is disadvantageous in that it requires two sine and cosine components as reference signals, and besides the orthogonality of such two components must be adjusted with a very high degree of accuracy so that the error thereof may be lower than 3 degrees, or else, a required performance cannot be achieved.

Furthermore, since a system including a mixer circuit, a low pass filter and an analog to digital converter is required for each of two components having an orthogonal phase relationship to each other, a total of two circuits are required. In addition, since each of the output signals of the low-pass filters 15C and 15S is a base band component which includes a dc current component therein, an amplifier for such base band component including a dc current component is required, which makes construction of the demodulating apparatus difficult.

SUMMARY OF THE INVENTION

It is an object of the present invention to provide a digital demodulating apparatus which is not influenced by a degree of accuracy of a local oscillation signal.

It is another object of the present invention to provide a digital demodulating apparatus which does not process a base band frequency and can be constructed readily.

It is a further object of the present invention to provide a digital demodulating apparatus which includes a single circuit of an analog to digital converter, a low pass filter and so forth and is simplified in overall construction.

In order to attain the objects, according to the present invention, there is provided a digital demodulating apparatus which comprises an analog to digital converter for converting an input modulated signal having a carrier frequency of fc and a bandwidth of 2B into a digital signal with a sampling clock signal of a sampling frequency of fs, a sampling clock generating circuit for generating a clock signal of the sampling frequency fs which is defined as $$fc \simeq (2m+1)/4 \cdot fs$$

and $f_s > 4B$ m being an arbitrary integer, an orthogonal component extracting circuit for extracting, from an output digital signal of the analog to digital converter, two components which are different by (an odd number/2)·π in phase from each other, and a demodulator of the digital signal processing type for receiving such two extracted components from the orthogonal component extracting circuit and producing a demodulated signal from the two received components.

With the digital demodulating apparatus, since the analog to digital converter samples an input demodulated signal with the frequency fs which has such a specific relationship to the carrier frequency fc of the input modulated signal as described above, each adjacent samples is displaced by (an odd number/2)π in phase from each other. Consequently, the orthogonal component extracting circuit can extract orthogonal components, for example, only by separating odd-numbered samples and even-numbered samples from each other.

Thus, since the digital demodulating apparatus does not have a construction such that an output of a local oscillator is divided into two cosine and sine components having orthogonal phases to each other and an input signal is frequency converted into a base band to separate the same into two orthogonal phase components as in the conventional demodulating apparatus described hereinabove, the performance thereof is not influenced by an error of orthogonality of orthogonal local oscillation signals for frequency conversion, as distinguished from the conventional demodulating apparatus.

Further, since the digital demodulating apparatus need not process a base band frequency as in the conventional demodulating apparatus, it does not require a dc amplifier which is difficult to construct.

The digital demodulating apparatus is further advantageous in that it includes only one circuit of an analog to digital converter, a low-pass filter and so forth, and consequently it can be constructed in a simplified construction as a whole.

The orthogonal component extracting circuit may include a sampling changing over signal generating circuit for receiving the sampling clock signal from the sampling clock generating circuit and generating a sampling changing over signal, a data dividing switch circuit for receiving output digital data of the analog to digital converter and outputting the received digital data alternately from a pair of output terminals thereof in response to a sampling changing over signal received from the sampling changing over signal generating circuit, and a pair of multiplying circuits for individually multiplying output signals from the output terminals of the data dividing switch circuit alternately by the values of "+1" and "−1" each time a clock is generated from the sampling clock generating circuit.

Or alternatively, the orthogonal component extracting circuit may include a first coefficient supplying circuit responsive to the sampling clock signal of the sampling clock generating circuit for generating the coefficient of "0" for every other clock of the sampling clock signal and generating the coefficients of "+1" and "−1" alternately for every other one of the remaining clocks of the sampling clock signal, a second coefficient supplying circuit responsive to the sampling clock signal of the sampling clock generating circuit for generating a series of coefficients which are same as but are delayed by one clock distance from the series of coefficients generated from the first coefficient supplying circuit, and first and second multiplying circuits for multiplying output digital data of the analog to digital converter by the coefficients supplied from the first and second coefficient supplying circuits, respectively.

The above and other objects, features and advantages of the present invention will become apparent from the following description and the appended claims, taken in conjunction with the accompanying drawings.

DETAILED DESCRIPTION OF THE PREFERRED EMBODIMENT

Figure 1:
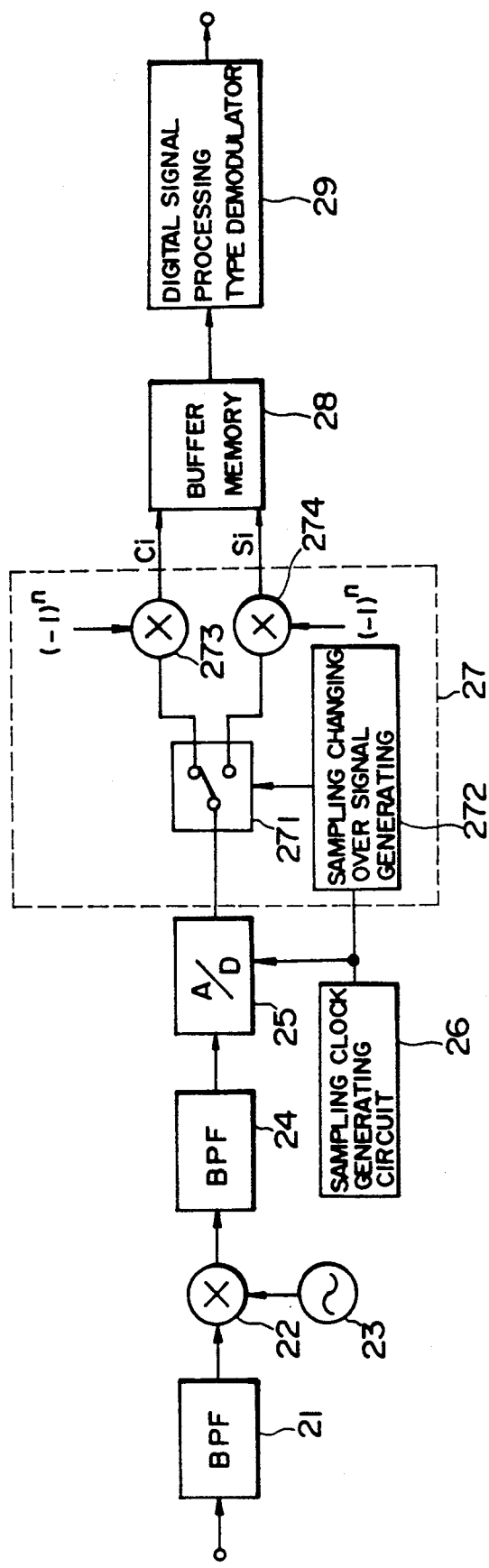
FIG. 1 is a block diagram of part of a narrow band signal receiver in which a digital demodulating apparatus is incorporated showing a preferred embodiment of the present invention.

Referring first to FIG. 1, there is shown part of a narrow band signal receiver in which a digital demodulating apparatus according to the present invention is incorporated. The narrow band signal receiver is employed, for example, in a mobile radio telephone set.

The narrow band signal receiver shown includes a band pass filter 21 to which a high frequency received signal in the form of a modulated signal of a carrier frequency $f_{RF}$, for example, 1 GHz, received, for example, by way of an antenna not shown is supplied. The band pass filter 21 removes out-band components, that is, unnecessary frequency band components other than an object frequency band component from the high frequency reception signal supplied thereto, and an output signal of the band pass filter 21 is supplied to a mixer circuit 22. An oscillation signal of a frequency $f_{LO}$ is produced from a fixed local oscillator 23 and supplied to the mixer circuit 22, at which it is multiplied by the reception signal received from the mixer circuit 22. Accordingly, the mixer circuit 22 outputs an intermediate frequency signal having a carrier frequency of an intermediate frequency fc ($fc = f_{LO} - f_{RF}$ or $fc = f_{RF} - f_{LO}$) into which the carrier frequency of the reception signal is frequency converted, and such intermediate frequency signal is supplied to another band pass filter 24, at which outband components are removed therefrom. The intermediate frequency fc may be, for example, 15 MHz.

An output signal of the band pass filter 24 is supplied to an analog to digital converter 25, at which it is sampled with a clock signal of a sampling frequency fs from a sampling pulse generating circuit 26, and a thus sampled value is converted into a digital signal.

In this instance, the sampling frequency fs is determined such that the carrier frequency has the following relationship to the intermediate frequency fc:

$$fc = \{(2m+1)/4\} \cdot fs \quad (3)$$

where m is an integer.

Further, where the frequency band of an output signal of the band pass filter 24 is determined to fall within a range of ±B with respect to the intermediate frequency fc, i.e. the output of the band pass filter is between ($f_c - B$) and ($f_c + B$), frequency fs is determined, in order to satisfy a sampling theorem, as $$fs > 2B \times 2 = 4B \quad (4)$$

Figure 2:
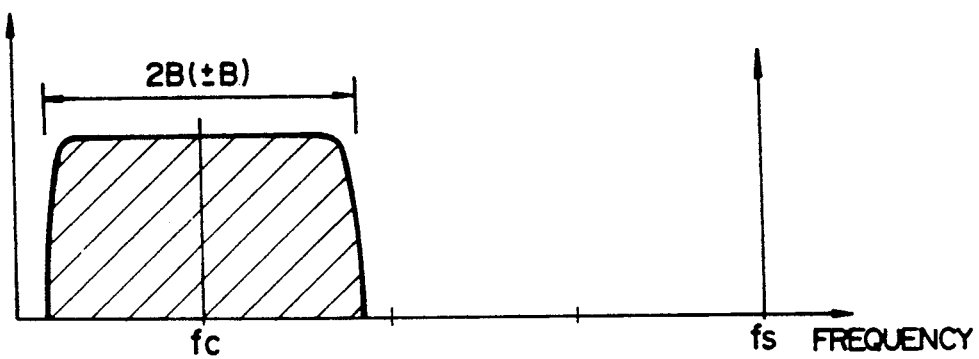
FIGS. 2 and 3 are diagrams illustrating different frequency allocations with the digital demodulating apparatus of FIG. 1.

In the case of, for example, fc = ¼·fs, a reception signal and those frequencies fc and fs have such a relationship as seen from FIG. 2. In this instance, fs = 60 MHz.

In this instance, since a signal of the intermediate frequency fc is sampled with a sampling clock signal of the frequency fs equal to four times the intermediate frequency fc by the analog to digital converter 25, sampling is performed for each 90 degrees in phase.

Figure 3:
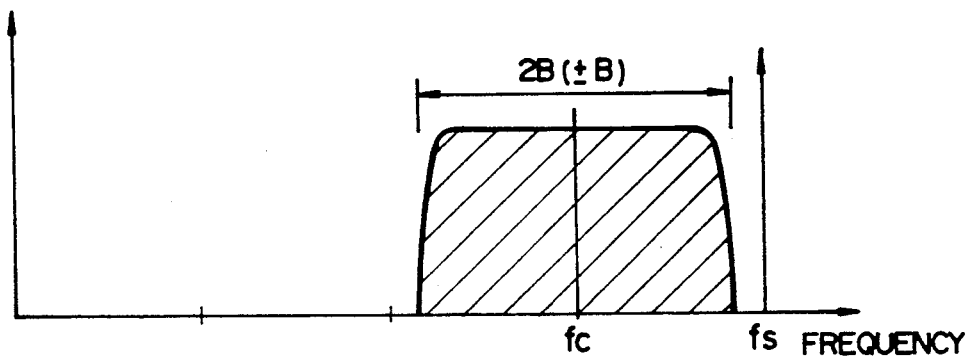

On the other hand, otherwise in the case of, for example, fc = ¾·fs, a reception signal and the sampling frequency fs has such a relationship as seen from FIG. 3. In this instance, fs = 20 MHz.

In this instance, since a signal of the intermediate frequency fc is sampled with a sampling clock signal of the frequency fs equal to four thirds times the intermediate frequency fc, sampling is performed for each 270 degrees (90°×3) in phase.

Output digital data of the analog to digital converter 25 are supplied to an orthogonal component extracting circuit 27.

In the orthogonal component extracting circuit 27, output data of the analog to digital converter 25 are supplied to a data dividing switch circuit 271. Meanwhile, a sampling clock signal from the sampling clock generating circuit 26 is supplied to a sampling changing over signal generating circuit 272. Consequently, a changing over signal which is reversed in phase for each sample data is obtained from the sampling changing over signal generating circuit 272. Thus, the switch circuit 271 is changed over for each sample data in response to such changing over signal from the sampling changing over signal generating circuit 272 so that each odd-numbered one of sample data is supplied to a multiplying circuit 273 which serves as a data reversing circuit while each even-numbered one of sample data is supplied to another multiplying circuit 274 which serves as another data reversing circuit. A value $(-1)^n$ (n = 0, 1, 2, ..., and the value of n is incremented or decremented each time sample data are inputted to the two amplifying circuits 273 and 274) is supplied to the multiplying circuits 273 and 274. Consequently, input sample data to the multiplying circuits 273 and 274 are alternately multiplied by the values "+1" and "−1" for each sample.

Such an operation as described above will be described more in detail with reference to FIG. 4 by way of an example wherein the intermediate frequency fc is determined to be equal to fc = ¼·fs.

As described hereinabove, in the case of fc = ¼·fs, output sample data of the analog to digital converter 25 correspond to a signal of the intermediate frequency fc which is obtained by sampling at a phase position different by $\pi/2$ for each sample. Accordingly, input data delivered alternately from the switch circuit 271 for each sample to the multiplying circuits 273 and 274 are sample data at phase positions which are displaced by $\pi/2$ from each other. Besides, such input data to the multiplying circuits 273 and 274 are data at positions the phases of which are displaced by $\pi$ from each other for each sample.

Figure 4:
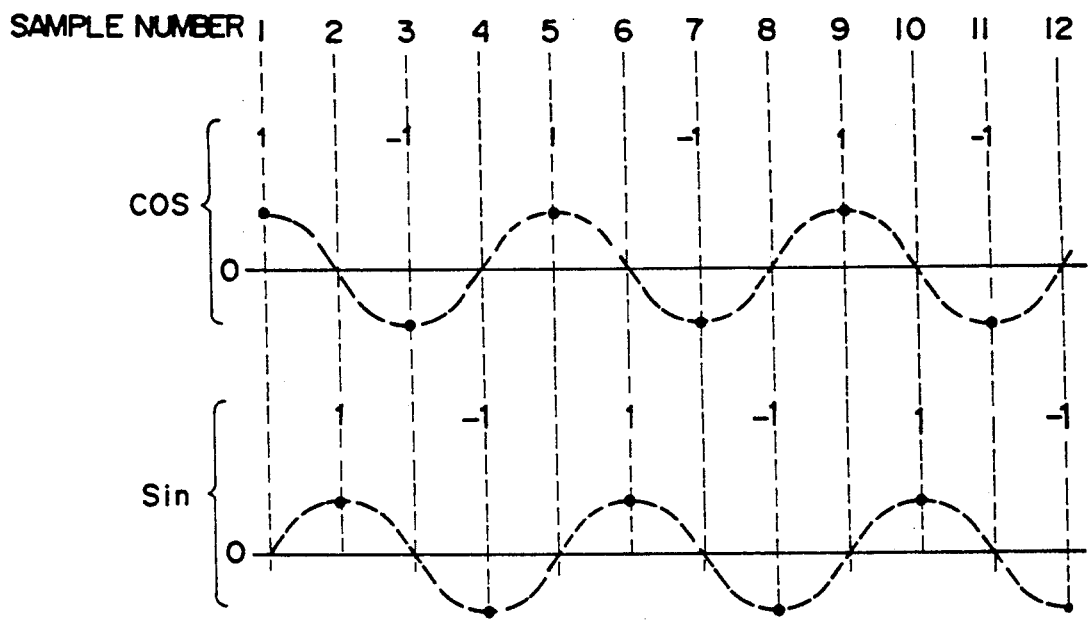
FIG. 4 is a diagram illustrating operation of the digital demodulating apparatus of FIG. 1.

Accordingly, since data are reversed for each sample at the multiplying circuits 273 and 274, a cosine component of a signal of the intermediate frequency fc is obtained from the multiplying circuit 273 while a sine component of the signal of the intermediate frequency fc is obtained from the other multiplying circuit 274 as seen from FIG. 4. The cosine and sine components correspond to nothing but the results of sampling of a real part and an imaginary part, respectively, of the expression (2) of the complex number representation given hereinabove. In other words, two orthogonal components Ci and Si extracted from the signal of the intermediate frequency fc are obtained from the multiplying circuits 273 and 274, respectively.

As described so far, in the case of fc = 2m + ¼·fs, output data samples of the analog to digital converter 25 are data at phase positions different by $\pi/2 \times (2m+1)$ for each sample, and accordingly, two mutually orthogonal components are obtained from the orthogonal component extracting circuit 27.

The two orthogonal components Ci and Si obtained from the orthogonal component extracting circuit 27 are supplied by way of a buffer memory 28 to a digital signal processing type demodulator 29, at which demodulation of the two orthogonal components Ci and Si is performed in a similar manner as described hereinabove in connection with the conventional demodulating apparatus.

It is to be noted that, while the orthogonal component extracting circuit 27 in the embodiment described above is constructed from a switch circuit and two multiplying circuits, it may be constructed alternatively only from two multiplying circuits. Such an alternative orthogonal component extracting circuit is shown in FIG. 5.

Figure 5:
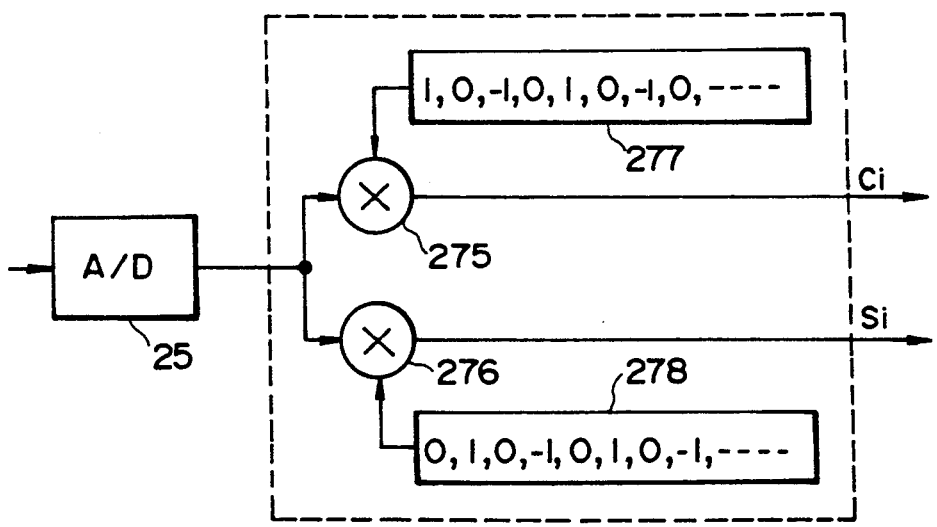
FIG. 5 is a block diagram showing an alternative orthogonal component extracting circuit of the digital demodulating apparatus of FIG. 1.
Figure 6:
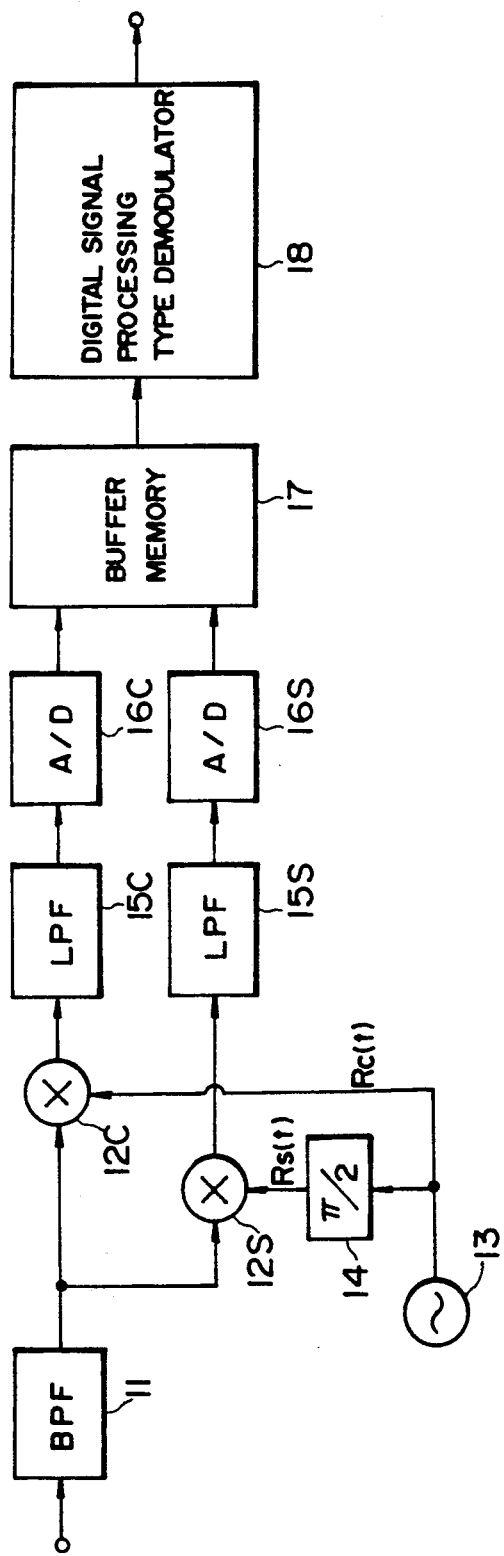
FIG. 6 is a block diagram showing a conventional digital modulating apparatus.

Referring to FIG. 5, the orthogonal component extracting circuit shown includes two multiplying circuits 275 and 276 connected to receive output data of the analog to digital converter 25.

Coefficients which are varied for each input sample are supplied from a pair of coefficient supplying circuits 277 and 278 to the multiplying circuits 275 and 276, respectively. In this instance, the coefficient "0" is supplied for every other sample from the coefficient supplying circuit 277 to the multiplying circuit 275, and the coefficients "1" and "−1" are supplied alternately for the remaining every other sample to the multiplying circuit 275. Meanwhile, a series of coefficients, which are same as but are delayed by one sample distance from the series of coefficients from the coefficient supplying circuit 277, are supplied from the coefficient supplying circuit 278 to the multiplying circuit 276.

With the construction described above, two mutually orthogonal components Ci and Si are obtained from the multiplying circuits 275 and 276, respectively, in a quite similar manner as in the case of the orthogonal component extracting circuit 27 of the digital demodulating apparatus of FIG. 1.

As described so far, with the construction of the digital demodulating apparatus of FIG. 1, since the digital demodulating apparatus does not have such a construction that an output of a local oscillator is divided into two cosine and sine components having orthogonal phases to each other and an input signal is frequency converted into a base band to separate the same into two orthogonal phase components as in the conventional demodulating apparatus described hereinabove, the performance thereof is not influenced by an error of orthogonality of orthogonal local oscillation signals for frequency conversion, as is different from the conventional demodulating apparatus.

Further, since an input signal is not converted into a base band by frequency conversion as in the conventional demodulating apparatus but is converted into an intermediate frequency, the digital demodulating apparatus of FIG. 1 need not process a base band frequency as in the conventional demodulating apparatus, and accordingly, a dc amplifier which is difficult to construct is not required. Further, since the degree of freedom in intermediate frequency is high, it is easy to select, as such an intermediate frequency, a frequency with which various parts such as a filter can be constructed readily.

Besides, the digital demodulating apparatus of FIG. 1 is advantageous in that it includes only one circuit of an analog to digital converter, a low-pass filter and so forth and consequently it can be constructed in a simplified construction as a whole.

It is to be noted that the present invention can be applied not only to a digital demodulating apparatus for use with a receiver of such PSK/TDMA communications system as described above but also to a radio wave receiver for a narrow band demodulated signal in which all or part of the operation of a demodulator is performed by digital signal processing.

Having now fully described the invention, it will be apparent to one of ordinary skill in the art that many changes and modifications can be made thereto without departing from the spirit and scope of the invention as set forth herein.

What is claimed is:

1. A digital demodulating apparatus, comprising:
an analog to digital converter for converting an input modulated signal having a carrier frequency of fc and a bandwidth of 2B (i.e. fc−B to fc+B, where B is a predetermined number) into a digital signal with a sampling clock signal of a sampling frequency of fs;
a sampling clock generating circuit for generating a clock signal of the sampling frequency fs which is defined as $$fc = (2m+1)/4 \cdot fs$$

and $$fs > 4B$$

m being an arbitrary integer;
an orthogonal component extracting circuit for extracting, from an output digital signal of said analog to digital converter, two components which are different by (an odd number/2)·π in phase from each other; and
a demodulator of the digital signal processing type for receiving such two extracted components from said orthogonal component extracting circuit and producing a demodulated signal from the two received components.

2. A digital demodulating apparatus according to claim 1, wherein said orthogonal component extracting circuit includes a sampling changing over signal generating circuit for receiving the sampling clock signal from said sampling clock generating circuit and generating a sampling changing over signal, a data dividing switch circuit for receiving output digital data of said analog to digital converter and outputting the received digital data alternately from a pair of output terminals thereof in response to a sampling changing over signal received from said sampling changing over signal generating circuit, and a pair of multiplying circuits for individually multiplying output signals from said output terminals of said data dividing switch circuit alternately by the values of "+1" and "−1" each time a clock is generated from said sampling clock generating circuit.

3. A digital demodulating apparatus according to claim 1, wherein said orthogonal component extracting circuit includes a first coefficient supplying circuit responsive to the sampling clock signal of said sampling clock generating circuit for generating the coefficient of "0" for every other clock of the sampling clock signal and generating the coefficients of "+1" and "−1" alternately for every other one of the remaining clocks of the sampling clock signal, a second coefficient supplying circuit responsive to the sampling clock signal of said sampling clock generating circuit for generating a series of coefficients which are same as but are delayed by one clock distance from the series of coefficients generated from said first coefficient supplying circuit, and first and second multiplying circuits for multiplying output digital data of said analog to digital converter by the coefficients supplied from said first and second coefficient supplying circuits, respectively.

* * * * *